United States Patent [19]

Fujiyama

[11] Patent Number: 5,309,156
[45] Date of Patent: May 3, 1994

[54] VARIABLE-LENGTH CODE DECODING DEVICE

[75] Inventor: Takehiko Fujiyama, Kawasaki, Japan

[73] Assignee: Fujitsu Limited, Japan

[21] Appl. No.: 833,375

[22] Filed: Feb. 10, 1992

[30] Foreign Application Priority Data

Feb. 13, 1991 [JP] Japan .................................. 3-019691

[51] Int. Cl.⁵ ............................................. H03M 7/40
[52] U.S. Cl. .................................................... 341/067
[58] Field of Search .................. 341/67, 59, 65, 79, 341/95, 106, 107; 358/261.1, 261.2, 261.4

[56] References Cited

U.S. PATENT DOCUMENTS

| 3,918,047 | 11/1975 | Denes . |
| 4,879,731 | 11/1989 | Brush .................................. 375/116 |
| 5,032,838 | 7/1991 | Murayama et al. .................... 341/67 |

FOREIGN PATENT DOCUMENTS

| 105740 | 9/1977 | Japan . |
| 114044 | 9/1981 | Japan . |
| 3548 | 1/1984 | Japan . |
| 72488 | 4/1985 | Japan . |
| 49429 | 2/1989 | Japan . |
| 246522 | 10/1990 | Japan . |

OTHER PUBLICATIONS

*1990 IEEE International Symposium on Circuits and Systems*, vol. 4, 1990, pp. 3030-3033.

*Primary Examiner*—A. D. Pellinen
*Assistant Examiner*—Brian K. Young
*Attorney, Agent, or Firm*—Welsh & Katz, Ltd.

[57] ABSTRACT

A variable-length code decoding device includes a serial-to-parallel converter for converting serial data into parallel data for every N bits where N is an integer. The serial data includes consecutive data pieces having variable data lengths. A buffer stores the parallel data which is sequentially read out therefrom for every 2 N bits and which is shifted by N bits in a high-order-bit direction in response to a carry signal. A register stores a shifted number "j" which is read out therefrom in response to a clock signal. The shifted number "j" indicates the number of bits to be shifted. A barrel shifter receives the parallel data from the buffer memory and shifts, by the shifted number "j", the parallel data in the high-order-bit direction so that N-bit parallel data having a starting bit which corresponds to an (j+1)th bit of the parallel data from a most significant bit thereof is output from the barrel shifter. A shifted number/carry signal generator generates, on the basis of a code length of effective data contained in the N-bit parallel data and the shifted number stored in the register, an updated shifted number and the carry signal. The shifted number stored in the register is updated by the updated shifted number.

6 Claims, 6 Drawing Sheets

VARIABLE-LENGTH CODE DECODING DEVICE

BACKGROUND OF THE INVENTION

(1) Field of the Invention

The present invention generally relates to digital signal processing, and more particularly to a device for decoding a series signal including a plurality of data pieces described by codes having variable code lengths to reproduce the original equi-length codes.

(2) Description of the Related Art

Variable-length coding is intended to enhance coding efficiency. For example, the CCITT Recommendation H.261 defines a variable-length code. In a conventional equi-length coding, data pieces are described by equi-length code words. In the variable-length coding, an event which frequently occurs is described by a short code word, and an event which does not frequently occur is described by a long code word. The average of the lengths of variable-length code words is smaller than the fixed length of equi-length code words. The variable-length coding as described above is widely used as an effective means for efficiently encoding video or image data.

In a system capable of transmitting the variable-length codes, only effective data pieces which may have different lengths are successively transmitted. On the receiver side, the effective data pieces are decoded in a decoding unit which consists of a predetermined number of consecutive bits, the most significant bit of which is the beginning bit of each of the effective data pieces. In this manner, equi-length codes are reproduced.

FIG. 1 is a block diagram of a conventional variable-length code decoding device. The device shown in FIG. 1 is composed of a S/P (Serial to Parallel) converter 1, a buffer memory 2, a barrel shifter 3, a code word decoder 4, a code length detector 5, a code length register 61, a shifted-number register 62, and a MOD(N) adder 7. Serial data transmitted via a transmission path interface port (not shown) is sequentially converted into parallel data for every N bits or every N-bit group (for example, one byte), and then stored in the buffer memory 2. This buffer memory 2 always stores 2 N-byte parallel data (two-byte parallel data) which consists of the previously received N-byte data and the N-byte data received at the present time. It is now assumed, for the sake of simplicity, that the buffer memory 2 always holds two bytes. The two-byte parallel data is always output from the buffer memory 2. When the buffer memory 2 receives a carry signal from the adder 7, the contents of the buffer memory 2 are updated so that it stores the current (latest) one-byte data and the next one-byte data. The barrel shifter 3, which is controlled by a shifted number "j" (the number of bits to be shifted), is formed with a bit shifter, and always inputs the two-byte parallel data from the buffer memory 2. The barrel shifter 3 shifts the two-byte parallel data by the shifted number "j" in a high-order-bit direction, and outputs data consisting of eight consecutive bits, the beginning bit of which is the (j+1)th bit from the most significant bit of the received two-byte parallel data. In this manner, the beginning bit of the effective data which is about to be processed by the code word decoder 4 is placed at the most significant bit of the one-byte parallel data output by the barrel shifter 3.

The code word decoder 4 is formed with a ROM (Read Only Memory), and receives, as an address signal, a bit pattern of the one-byte data output by the barrel shifter 3. A fixed-length code pattern specified by the bit pattern is read out from the code word decoder 4. The code length detector is formed with a ROM, which receives, as an address signal, the bit pattern output by the barrel shifter 3. The code length detector 5 stores various numbers of bits corresponding to various bit patterns. In response to the bit pattern from the barrel shifter 3, the number of bits (code length) which form the effective data from the barrel shifter 3 is output to the code length register 61. The effective data transmitted in the present system has a code length smaller than or equal to the number of bits N (one byte), and the last-bit position of the code is definitely determined by the pattern. Hence, it is possible to reproduce all fixed-length code words by storing all the fixed-length code words corresponding to all the possible code patterns in the code word decoder 4, and it is possible to detect the lengths of all effective data by storing the code lengths corresponding to all the possible code patterns.

The code-length data "m" output by the code length detector 5 is input to the adder 7 via the code length register 61. The register 62 holds the previous shifted number "j'", which is input to the adder 7. Then, the adder 7 executes a MOD(N) addition operation on the code length "m" and the previous shifted number "j'". The result of this addition is the updated shifted number "j".

A description will now be given of the operation of the variable-length code decoding device shown in FIG. 1. The code-length data m read out from the code length detector 5 is input to the code length register 61. The updated shifted number "j" output by the adder 7 is input to the register 62. Each of the registers 61 and 62 can be formed with a D-type flip-flop, which is driven by an operation clock signal CLK. After a predetermined operation delay time $\alpha$, the data m and j' are output from the registers 61 and 62, respectively, and input to the adder 7. After a predetermined operation delay time $\beta$, the result of the MOD(N) addition operation, "j", is output by the adder 7. If the result of the operation shows the number of bits smaller than N, j is equal to j'+m. If the result shows the number of bits equal to or larger than N, j is equal to j'+m−N, and a carry signal CRY is made active (that is, shows "1"). Since the shifted number is changed from "j'" to "j", the barrel shifter 3 shifts the two-byte parallel data by j bits, and outputs the shifted bits after a predetermined operation delay time $\gamma$. When the carry signal CRY is generated, the input from the buffer memory 2 to the barrel shifter 3 is switched to 2 N bits obtained by shifting the currently stored 2 N bits by N bits in the high-order-bit direction. The barrel shifter 3 shifts the updated 2 N bits by the shifted number "j" in the manner as described above. After a predetermined operation delay time $\delta$, the code length data "m" of the bit pattern output by the barrel shifter 3 is output by the code length detector 5.

It should be noted that the above-mentioned decoding process should be carried out within one cycle of the operation clock signal CLK. It takes a time (delay time) $\alpha+\beta+\gamma+\delta$ to calculate the shifted number "j" by a shifted number calculation loop. This delay time must be within one cycle of the operation clock signal CLK. Hence, the maximum frequency of the operation clock signal CLK is limited by the delay time necessary to obtain the shifted number "j".

SUMMARY OF THE INVENTION

It is a general object of the present invention to provide a variable-length code decoding device in which the above disadvantage is eliminated.

A more specific object of the present invention is to provide a variable-length code decoding device capable of calculating a shifted number at a higher speed.

The above objects of the present invention are achieved by a variable-length code decoding device comprising:

converter means for converting serial data into parallel data for every N bits where N is an integer, the serial data including consecutive data pieces having variable data lengths;

buffer memory means, coupled to the converter means, for storing the parallel data which is sequentially read out therefrom for every 2 N bits and which is shifted by N bits in a high-order-bit direction in response to a carry signal;

register means for storing a shifted number "j" which is read out therefrom in response to a clock signal, the shifted number "j" indicating the number of bits to be shifted;

barrel shifter means, coupled to the buffer memory means, for receiving the parallel data from the buffer memory means and for shifting, by the shifted number "j", the parallel data in the high-order-bit direction so that N-bit parallel data having a starting bit which corresponds to an (j+1)th bit of the parallel data from a most significant bit thereof is output from the barrel shifter means; and shifted number/carry signal generator means, coupled to the barrel shifter means and the register means, for generating, on the basis of a code length of effective data contained in the N-bit parallel data and the shifted number stored in the register means, an updated shifted number and the carry signal, the shifted number stored in the register means being updated by the updated shifted number.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

Figure 1:
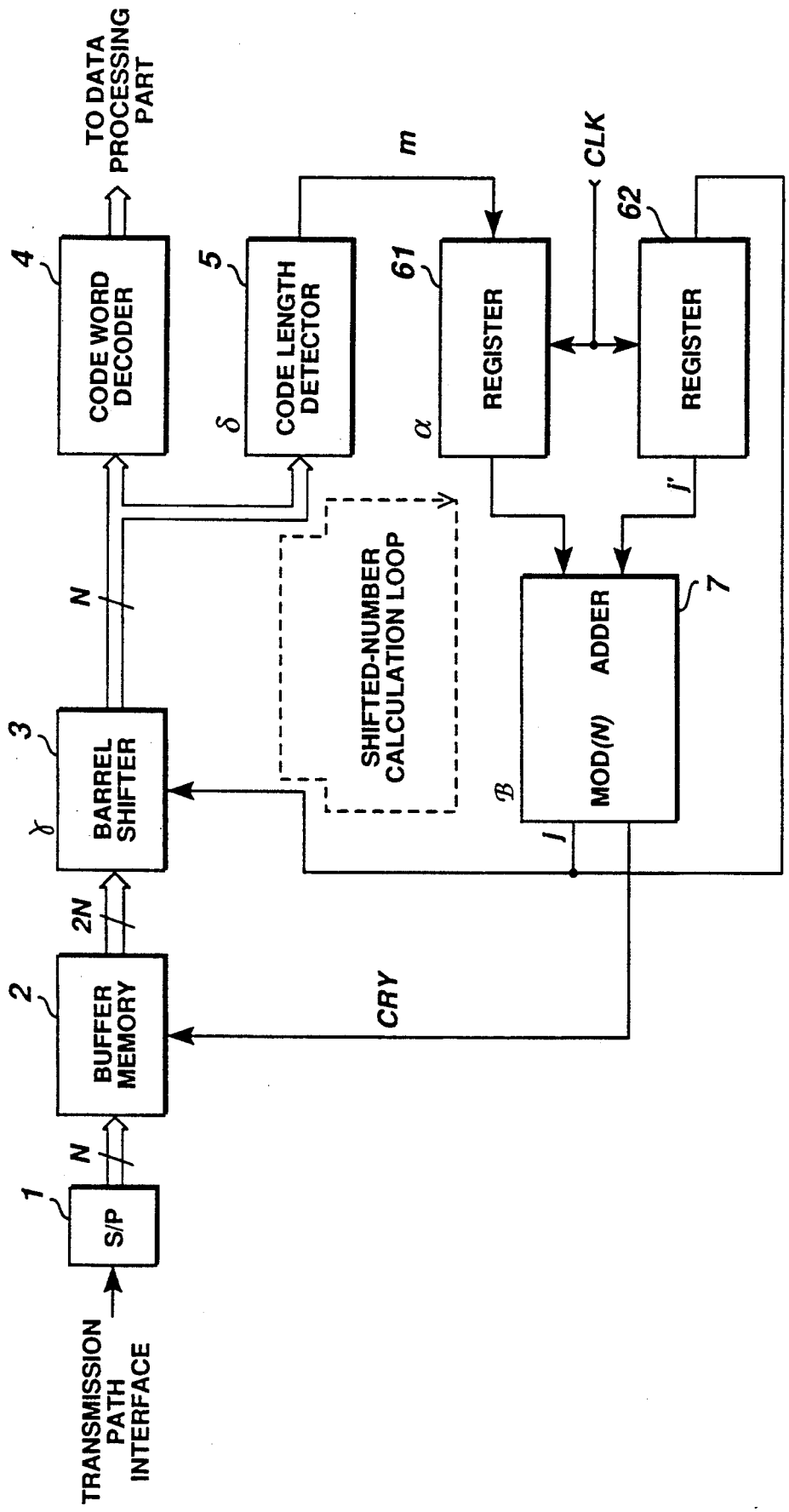
FIG. 1 is a block diagram of a conventional variable-length code decoding device.
Figure 2:
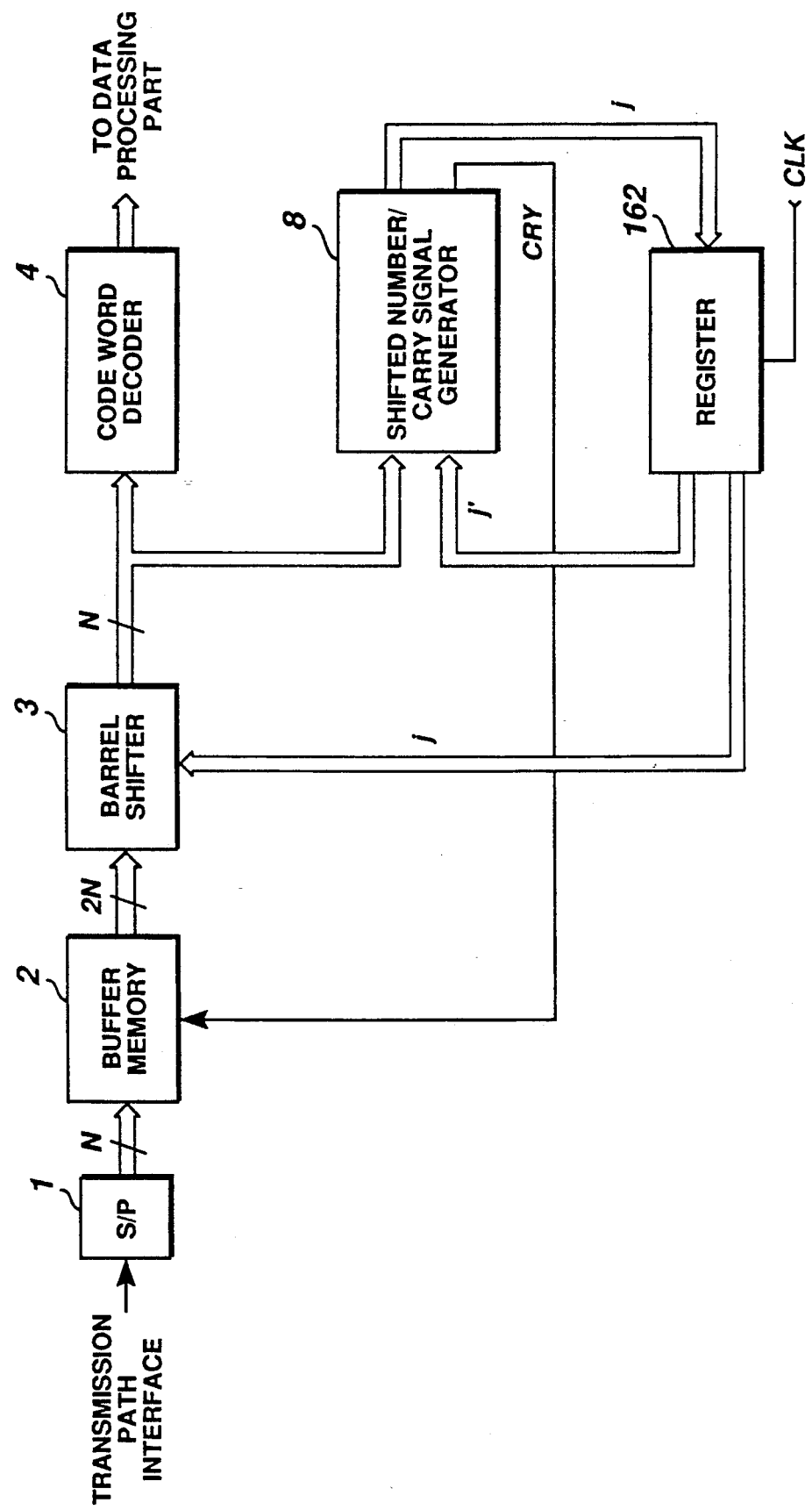
FIG. 2 is a block diagram showing an outline of the present invention.

FIG. 2 is a block diagram showing an outline of the present invention. In FIG. 2, parts which are the same as those shown in FIG. 1 are given the same reference numerals. A variable-length code decoding device shown in FIG. 2 has a shifted number/carry signal generator 8 and a shifted number register 162, all of which are substituted for the code length detector 5, the adder 7, and the registers 61 and 62. The shifted number/carry signal generator 8 receives the previous shifted number "j'" read out from the register 162 and the N-bit data output by the barrel shifter 3, and generates an updated shifted number "j" and the carry signal CRY. In response to the clock signal CLK, the updated shifted number "j" is written into the register 162. The updated shifted number "j" is calculated on the basis of the code length of effective data contained in the N-bit data from the barrel shifter 3, and the previous shifted number "j'" read out from the register 162 so that the beginning bit of the next effective data is placed at the most significant bit of the one-byte bit pattern.

As will be described later, the shifted number/carry signal generator 8 can be formed with a ROM. It is to be noted that it takes the sum of the delay times of the barrel shifter 3, the generator 8 and the register 162 to calculate the shifted number "j". Hence, the device shown in FIG. 2 can operate at a speed higher than that of the device shown in FIG. 1.

Figure 3:
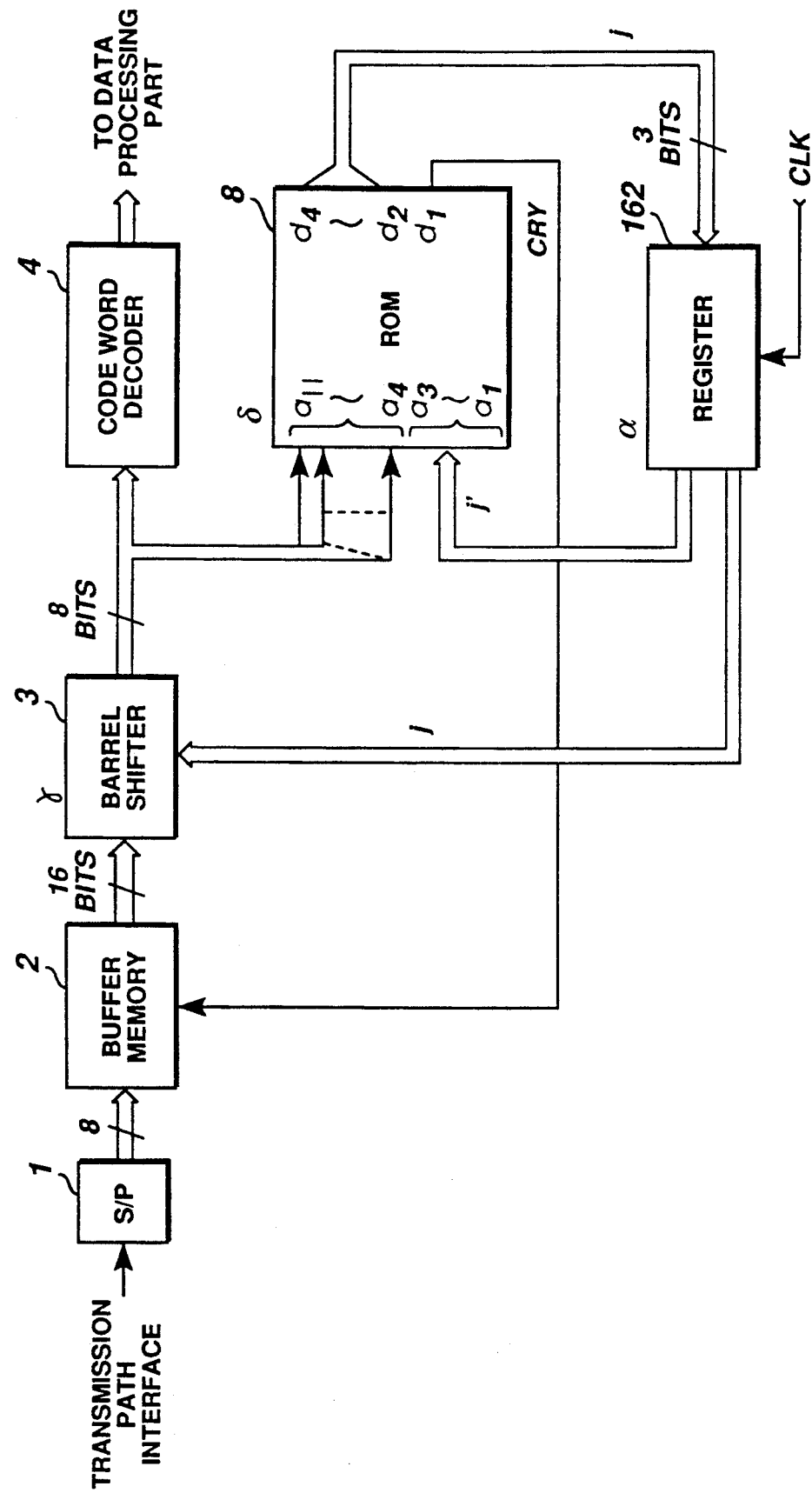
FIG. 3 is a block diagram of an embodiment of the present invention.

FIG. 3 is a block diagram of an embodiment of the present invention. In FIG. 3, parts which are the same as those shown in FIG. 2 are given the same reference numerals. As shown in FIG. 3, the shifted number/carry signal generator 8 is formed with a ROM, which receives an address signal consisting of 11 bits a1-a11, and four output bits d1-d4. Eight high-order bits a11-a4 of the address signal are eight bits output by the barrel shifter 3, and three low-order bits a3-a1 thereof are three bits forming the previous shifted number "j'" read out from the register 162. Three high-order bits d4-d2 show the current or updated shifted number "j" calculated based on the eight bits from the barrel shifter 3 and the three-bit previous shift register "j'". The ROM 8 stores all bit patterns consisting of bits d4-d1 corresponding to all combinations of bits a11-a1. The three high-order bits indicating the number of shifts "j" are stored in the register 162 and then input to the ROM 8, as the previous shifted number "j'".

Figure 4:
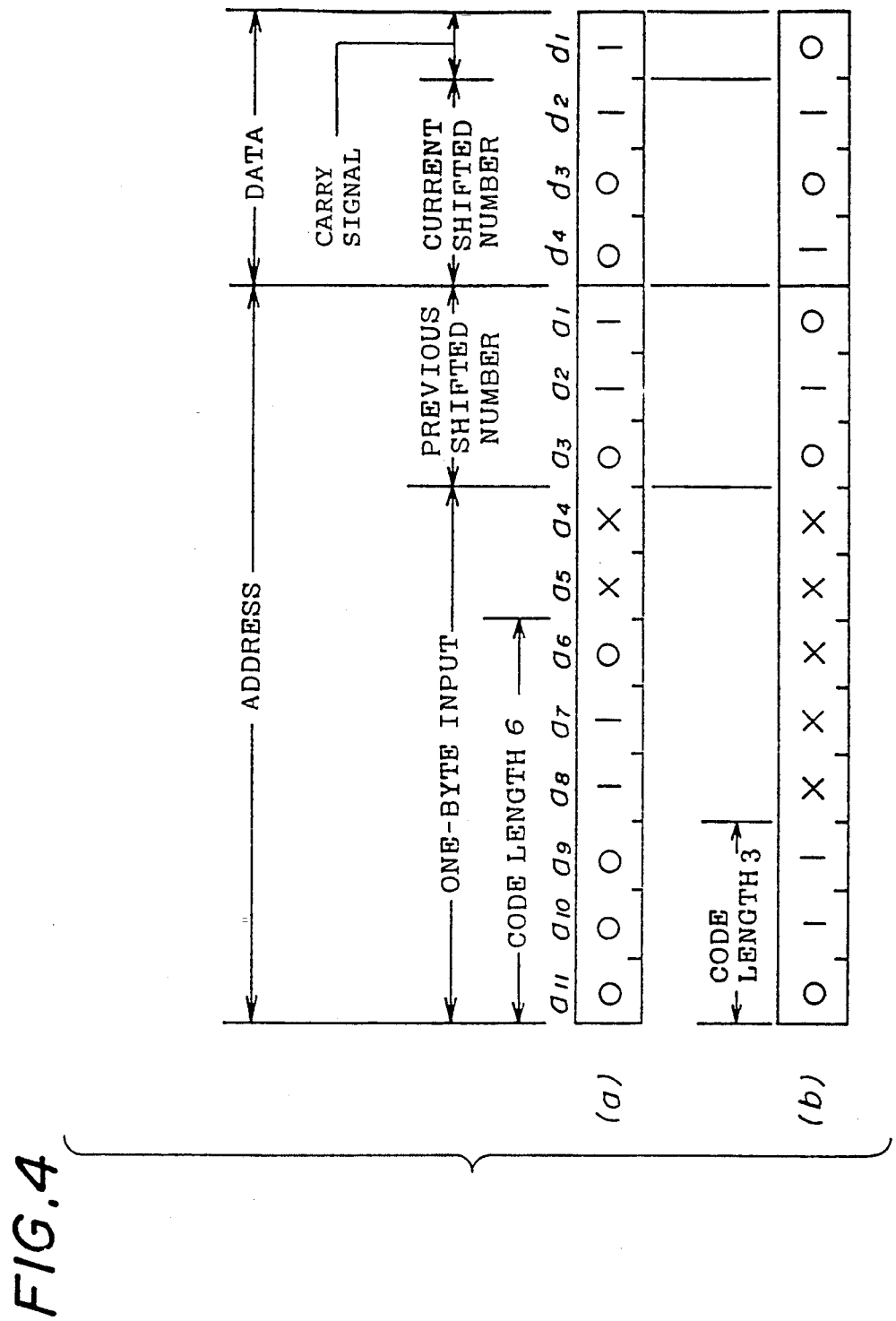
FIG. 4 is a diagram showing the contents of a ROM shown in FIG. 3.

FIG. 4 is a diagram showing the contents of the ROM 8 which forms the shifted number/carry signal generator shown in FIG. 2. FIG. 4-(a) shows 8-bit (one byte) input data "000110XX" (X may be either "0" or "1") which includes effective data having a length of six bits from the most significant bit of the 8-bit input data and the previous shifted number "j'" is equal to 3 (="011"). The address of the ROM 8 obtained in this case is "000110XX011". In a storage area of the ROM 8 specified by this address, data "0011" which is calculated beforehand is stored in which the three high-order bits d4-d2 show (j'+m) or (J+m−N) and the least significant bit d1 shows the carry signal CRY. For the address "000110XX011", the sum of the effective data length "6" and the previous shifted number "3" is "9". Hence, the three high-order bits d4-d2 are "001", and the carry signal CRY is made active ("1"). That is, four-bit data "0011" is read out from the ROM 8 in response to the address "000110XX011".

FIG. 4-(b) shows 8-bit (one byte) input data "011XXXXX" (X may be "0" or "1") which includes effective data having a length of three bits from the most significant bit of the 8-bit input data and the previous shifted number "j'" is equal to 2 (="010"). The address of the ROM 8 obtained in this case is "011XXXXX010". In a storage area of the ROM 8 specified by this address, data "1010" which is calculated beforehand is stored. In this case, the sum of the effective data length "3" and the previous shifted number "2" is "5". Hence, the three high-order bits d4-d2 are "101", and the carry signal CRY is made inactive ("0"). That is, four-bit data "1010" is read out from the ROM 8 in response to the address "011XXXXX010". In the manner as described above, the ROM 8 stores data (consisting of the shifted number and the carry signal) corresponding to all 11-bit address patterns.

Figure 5:
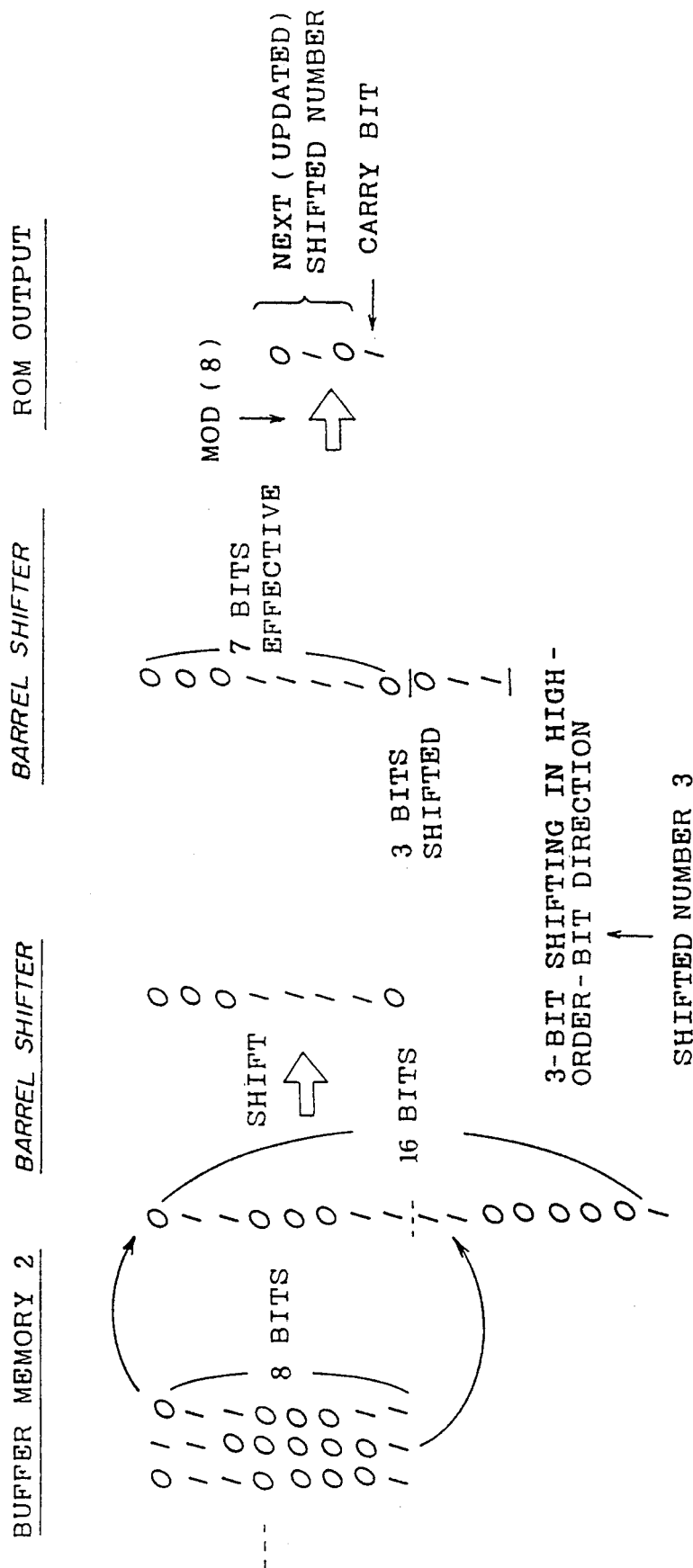
FIG. 5 is a diagram showing how data is processed in the embodiment of the present invention shown in FIG. 3.

FIG. 5 is a diagram showing how data is processed in the variable-length code decoding device shown in FIG. 3.

The barrel shifter 3 and the register 162 have the operation delay times $\gamma$ and $\alpha$, respectively. The ROM 8 has an operation delay time $\beta$ equal to that of the code length detector 5 formed with a ROM. Hence, it takes the total delay time $\alpha + \beta + \gamma$ to obtain the shifted number "j". That is, the device shown in FIG. 3 is faster than the conventional device shown in FIG. 1 by the delay time $\delta$ of the adder 7 shown in FIG. 1. In addition, the device shown in FIG. 3 can be made compact, as compared with the conventional device shown in FIG. 1.

It is also possible for the shifted number/carry signal generator 8 to be formed with another device in which one output pattern is specified by one input pattern. For example, the generator 8 can be formed with a PLA (Programmable Logic Array).

Figure 6:
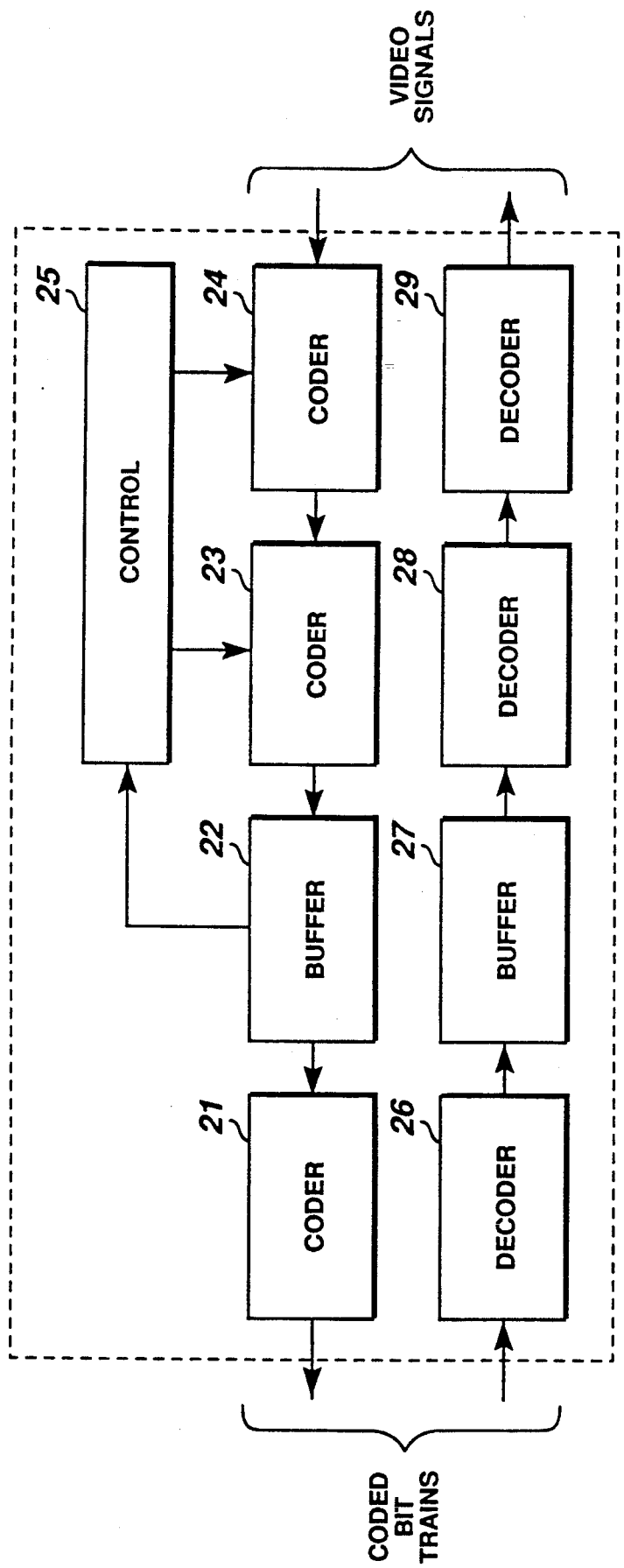
FIG. 6 is a block diagram of a video codec to which the present invention is applied.

FIG. 6 is a block diagram of a video codec to which the present invention is applied. The video codec (coder/decoder) shown in FIG. 6 is composed of a transmission coder 21, a transmission buffer 22, a video signal multiplexing coder 23, an information source coder 24, a coding controller 25, a transmission decoder 26, a receiver buffer 27, a video signal multiplexing decoder 28 and an information source decoder 29. The receive buffer 27 corresponds to the aforementioned buffer memory 2, and the video signal multiplexing decoder 28 corresponds to the barrel shifter 3, the code word decoder 4, the ROM 8 and the register 162.

The present invention is not limited to the specifically disclosed embodiments, and variations and modifications may be made without departing from the scope of the present invention.

What is claimed is:

1. A variable-length code decoding device comprising:
    converter means for converting serial data into parallel data for every N bits where N is an integer, said serial data including consecutive data pieces having variable data lengths;
    buffer memory means, coupled to said converter means, for storing the parallel data which is sequentially read out therefrom for every N bits and which is shifted by N bits in a high-order-bit direction in response to a carry signal;
    register means for storing a shifted number "j" which is read out therefrom in response to a clock signal, said shifted number "j" indicating the number of bits to be shifted;
    barrel shifter means, coupled to said buffer memory means, for receiving the parallel data from the buffer memory means and for shifting, by the shifted number "j", the parallel data in the high-order-bit direction so that N-bit parallel data having a starting bit which corresponds to an (j+1)th bit of the parallel data from a most significant bit thereof is output from said barrel shifter means; and
    shifted number/carry signal generator means, coupled to said barrel shifter means and said register means, for generating, on the basis of a code length of effective data contained in said N-bit parallel data and the shifted number stored in the register means, an updated shifted number and said carry signal, said shifted number stored in the register means being updated by said updated shifted number, said shifted number/carry signal generator including memory means for storing combinations of the updated shifted number and the carry signal corresponding to all combinations of data lengths of possible effective data and the shifted number and wherein the code length of the effective data contained in said N-bit parallel data and the shifted number stored in the register means are input, as an address signal, to said memory means.

2. A variable-length code decoding device as claimed in claim 1, wherein said memory means comprises a read only memory.

3. A variable-length code decoding device as claimed in claim 1, wherein said memory means comprises a programmable logic array.

4. A variable-length code decoding device as claimed in claim 1, wherein said shifted number/carry signal generator means comprises means for generating said carry signal when a sum of said shifted number "j" stored in said register means and the code length of the effective data contained in said N-bit parallel data is larger than or equal to said N.

5. A variable-length code decoding device as claimed in claim 1, further comprising code word decoder means for generating a code word corresponding to said N-bit parallel data from said barrel shifter means.

6. A variable-length code decoding device as claimed in claim 1, wherein said serial data comprises video data.

* * * * *